(12) United States Patent
Pei et al.

(10) Patent No.: US 12,080,807 B2
(45) Date of Patent: Sep. 3, 2024

(54) III-NITRIDE DIODE WITH A MODIFIED ACCESS REGION

(71) Applicant: Cambridge Electronics, Inc., Cambridge, MA (US)

(72) Inventors: Dongfei Pei, Waban, MA (US); Bin Lu, Fremont, CA (US)

(73) Assignee: Finwave Semiconductor, Inc., Belmont, MA (US)

( * ) Notice: Subject to any disclaimer, the term of this patent is extended or adjusted under 35 U.S.C. 154(b) by 322 days.

(21) Appl. No.: 17/350,563

(22) Filed: Jun. 17, 2021

(65) Prior Publication Data

US 2021/0399145 A1  Dec. 23, 2021

Related U.S. Application Data

(60) Provisional application No. 63/041,422, filed on Jun. 19, 2020.

(51) Int. Cl.
*H01L 29/872* (2006.01)
*H01L 29/20* (2006.01)
(Continued)

(52) U.S. Cl.
CPC ........ *H01L 29/872* (2013.01); *H01L 29/2003* (2013.01); *H01L 29/207* (2013.01); *H01L 29/402* (2013.01)

(58) Field of Classification Search
None
See application file for complete search history.

(56) References Cited

U.S. PATENT DOCUMENTS

2007/0278518 A1  12/2007  Chen et al.
2014/0091312 A1*  4/2014  Jeon ................. H01L 29/66204
                                                438/135
(Continued)

FOREIGN PATENT DOCUMENTS

JP   2008-172055 A   7/2008
JP   2012-28409 A    2/2012

OTHER PUBLICATIONS

International Search Report and Written Opinion mailed Sep. 23, 2021 in corresponding PCT application No. PCT/US2021/037821.
(Continued)

*Primary Examiner* — Jack S Chen
(74) *Attorney, Agent, or Firm* — NIELDS, LEMACK & FRAME, LLC

(57) ABSTRACT

This disclosure describes the structure and technology to modify the free electron density between the anode electrode and cathode electrode of III-nitride semiconductor diodes. Electron density reduction regions (EDR regions) are disposed between the anode and cathode electrodes of the diode structure. In certain embodiments, the EDR regions are created using trenches. In other embodiments, the EDR regions are created by implanting the regions with a species that reduces the free electrons in the channel layer. In another embodiment, the EDR regions are created by forming a cap layer over the barrier layer, wherein the cap layer reduces the free electrons in the channel beneath the cap layer. In another embodiment, a cap layer may be formed in the EDR regions, and doped regions may be created outside of the EDR regions, wherein the impurities act as electron donors.

19 Claims, 18 Drawing Sheets

(51) Int. Cl.
    *H01L 29/207*     (2006.01)
    *H01L 29/40*     (2006.01)

(56) References Cited

U.S. PATENT DOCUMENTS

2019/0267456 A1    8/2019  Chen et al.
2021/0167202 A1    6/2021  Lu et al.

OTHER PUBLICATIONS

Zheng et al., "A novel AlGaN/GaN Schottky barrier diode with partial p-AlGaN cap layer and recessed dual-metal anode for high breakdown and low turn on voltage", Semiconductor Science and Technology, vol. 35, 2020.

\* cited by examiner

III-NITRIDE DIODE WITH A MODIFIED ACCESS REGION

This application claims priority of U.S. Provisional Patent Application Ser. No. 63/041,422, filed Jun. 19, 2020, the disclosure of which is incorporated herein in its entirety.

FIELD

Embodiments of the present disclosure relate to diode structures and methods for forming these diode structures.

BACKGROUND

Compared with conventional power devices made of silicon, Group III-Nitride (III-N) semiconductors possess excellent electronic properties that enable the fabrication of modern power electronic devices and structures for use in a variety of applications. The limited critical electric field and relatively high resistance of silicon make currently available commercial power devices, circuits and systems constrained with respect to operating frequencies. On the other hand, the higher critical electric field and higher electron density and mobility of III-N materials allow high-current, high-voltage, high-power and/or high-frequency performance of improved power diodes. These attributes are desirable in advanced transportation systems, high-efficiency electricity generation and conversion systems, and energy delivery networks.

Conventional III-nitride semiconductor diodes have a planar Schottky contact and a uniform carrier density between the anode electrode and the cathode electrode.

It would be beneficial if there were a diode structure with non-uniform electron density between the anode electrode and cathode electrode. Further, it would be advantageous if the non-uniform electron density distribution could be used for shaping the electric field.

SUMMARY

This disclosure describes the structure and technology to modify the free electron density between the anode electrode and cathode electrode of III-nitride semiconductor diodes. Electron density reduction regions (EDR regions) are disposed between the anode and cathode electrodes of the diode structure. In certain embodiments, the EDR regions are created using trenches. In other embodiments, the EDR regions are created by implanting the regions with a species that reduces the free electrons in the channel layer. In another embodiment, the EDR regions are created by forming a cap layer over the barrier layer, wherein the cap layer reduces the free electrons in the channel beneath the cap layer. In another embodiment, a cap layer may be formed in the EDR regions, and doped regions may be created outside of the EDR regions, wherein the impurities act as electron donors. In some embodiments, a field plate may be disposed on the EDR regions, and may be connected or separated from the EDR region.

According to one embodiment, a diode structure for use in a III-Nitride (III-N) semiconductor device is disclosed. The diode structure comprises a channel layer; a barrier layer, wherein electrons are formed at an interface between the channel layer and the barrier layer; an anode electrode in Schottky contact with the barrier layer; a cathode electrode disposed in an ohmic recess in contact with the barrier layer, wherein a region between the anode electrode and the cathode electrode is defined as the access region; and one or more electron density reduction regions disposed in the access region, wherein an electron density in the electron density reduction regions is reduced as compared to other portions of the access region. In certain embodiments, each electron density reduction region has a length (La) and a width (Wa), and is separated from an adjacent electron density reduction region by a separation distance (Wb), wherein the separation distance (Wb) changes moving from the anode electrode to the cathode electrode. In some embodiments, the electron density reduction regions comprise trenches wherein a depth of the trenches is less than, the same as, or greater than a thickness of the barrier layer. In certain embodiments, the electron density reduction regions comprise implanted regions in the barrier layer, wherein a depth of the implanted region is less than, the same as, or greater than a thickness of the barrier layer. In some embodiments, the implanted regions are implanted with nitrogen, argon, fluorine, or magnesium. In certain embodiments, the electron density reduction regions comprise a cap layer disposed on the barrier layer, and wherein the cap layer is not disposed on the barrier layer in the other portions of the access region, and the cap layer comprises a Mg-doped III-nitride semiconductor. In some embodiments, a cap layer is disposed on an entirety of the barrier layer in the access region, and wherein impurities are introduced into the cap layer disposed in the other portions of the access region to form doped regions and wherein the impurities are not introduced into the cap layer in the electron density reduction regions. In certain embodiments, the cap layer comprises a Mg-doped III-nitride semiconductor and the impurities comprise silicon, oxygen or hydrogen. In some embodiments, the electron density reduction regions extend at least partly beneath the anode electrode. In certain embodiments, a cap layer comprising a Mg-doped III-nitride semiconductor is disposed in the electron density reduction regions and not disposed in other portions of the access region. In some embodiments, the electron density reduction regions extend past the anode electrode. In certain embodiments, the Schottky contact between the anode electrode and the barrier layer comprises a plurality of disconnected regions. In some embodiments, a portion of a bottom surface of the anode electrode contacts a top surface of the electron density reduction regions. In some embodiments, a dielectric layer is disposed between a bottom surface of the anode electrode and a top surface of the electron density reduction regions. In certain embodiments, the anode electrode contacts at least a side of the cap layer. In some embodiments, a field plate is disposed above at least a portion of the electron density reduction regions, and wherein portions of the field plate are separated from the electron density reduction region by a dielectric layer. In certain embodiments, a cathode side edge of the electron density reduction regions is closer to the cathode electrode than a cathode side edge of the field plate. In some embodiments, the dielectric layer is disposed in the region between the anode electrode and the cathode electrode. In some embodiments, a second field plate is disposed between the field plate and the cathode electrode. In some embodiments, the field plate is connected to the anode electrode.

BRIEF DESCRIPTION OF THE FIGURES

For a better understanding of the present disclosure, reference is made to the accompanying drawings, which are incorporated herein by reference and in which.

DETAILED DESCRIPTION

Embodiments of the present disclosure relate to diode structures with non-uniform electron density between the anode electrode and cathode electrode. Some embodiments relate to non-uniform anode contact by having the EDR regions underneath the anode, such that the anode will have different reverse turn off voltages. By having the anode make Schottky contact with the barrier layer and also simultaneously make contact with the cap layer, as shown in FIGS. 6-7, diode reverse leakage current may be reduced. The semiconductor structures described herein may be formed of compound semiconductor materials, such as III-V semiconductor materials, and particularly Group III-Nitride (III-N) semiconductor materials.

This disclosure describes a new diode structure with a 3D structure wherein the carrier density is not continuous between the anode and cathode electrodes. The new structure improves the max voltage and reliability of the diode. Further, by having the anode contact the EDR region, the reverse leakage current may be reduced.

Figure 1A:
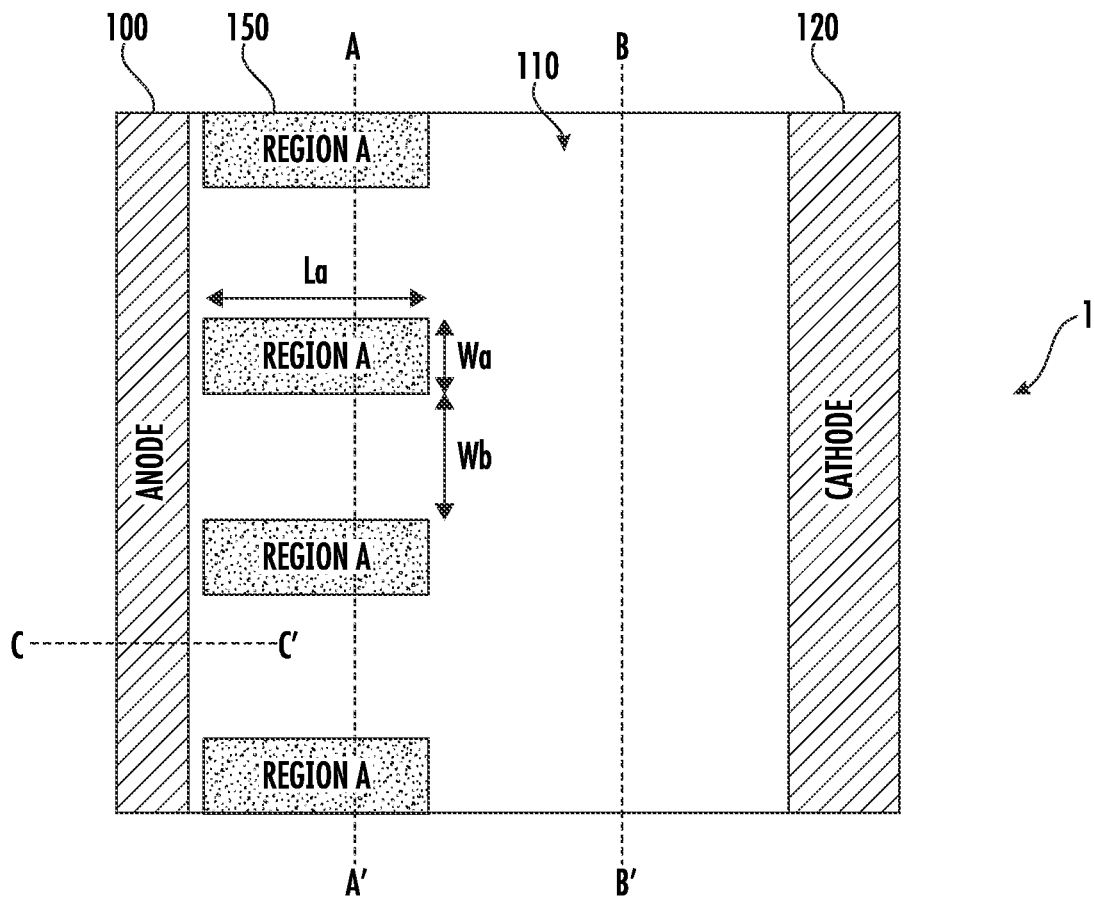
FIG. 1A is a top view of a diode structure according to one embodiment.

FIG. 1A shows a top view of a diode structure 1 comprising an anode electrode 100 and a cathode electrode 120. An access region 110 is disposed between the anode electrode 100 and the cathode electrode 120. The anode electrode 100 and the cathode electrode 120 may be made of material selected from titanium, aluminum, titanium nitride, tungsten, tungsten nitride, nickel, gold, copper, platinum, molybdenum, and any other suitable conductive material or combination of conductive materials. The anode electrode 100 and the cathode electrode 120 may be single or multiple layers comprises the metals or metal alloys listed above. The anode electrode 100 and the cathode electrode 120 may be the same material or different materials.

As shown in FIG. 1A, one or more electron density reduction regions, or EDR regions 150 are shown. Each of these regions may also be referred to as region-a. These EDR regions 150 may have a length of La, a width of Wa and separation distance of Wb. In this disclosure, length is defined as the direction from the anode electrode 100 to the cathode electrode 120. Width is the direction perpendicular to the length. Further, the EDR regions 150 are located between the anode electrode 100 and the cathode electrode 120 in the access region 110. In certain embodiments, portions of the EDR regions 150 may also be underneath the anode electrode 100.

Figure 1B:
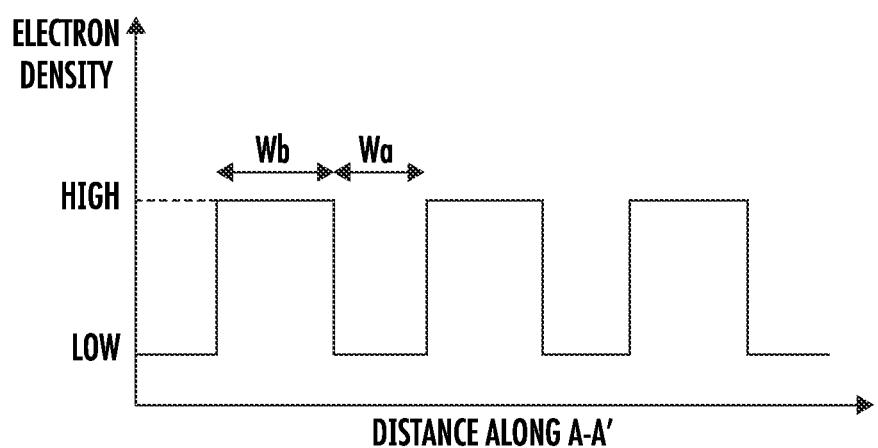
FIG. 1B is the electron density of the diode structure of FIG. 1A along line A-A'.

The existence of these EDR regions 150 serves to reduce the free electron density in these regions, as shown in FIG. 1B, as compared to regions in the access region 110 outside the EDR regions 150. The free electron density in EDR regions 150 can be as low as zero. Specifically, in the cross-section shown in FIG. 1B, the electron density in the portions of the access region 110 that correspond to the EDR regions 150 is less than the other portions of the access region 110.

Further, while FIG. 1B shows that the reduction of electron density achieved by each EDR region 150 is the same, it is understood that each EDR region 150 may reduce the electron density by any amount, independent of other EDR regions 150.

Figure 1C:
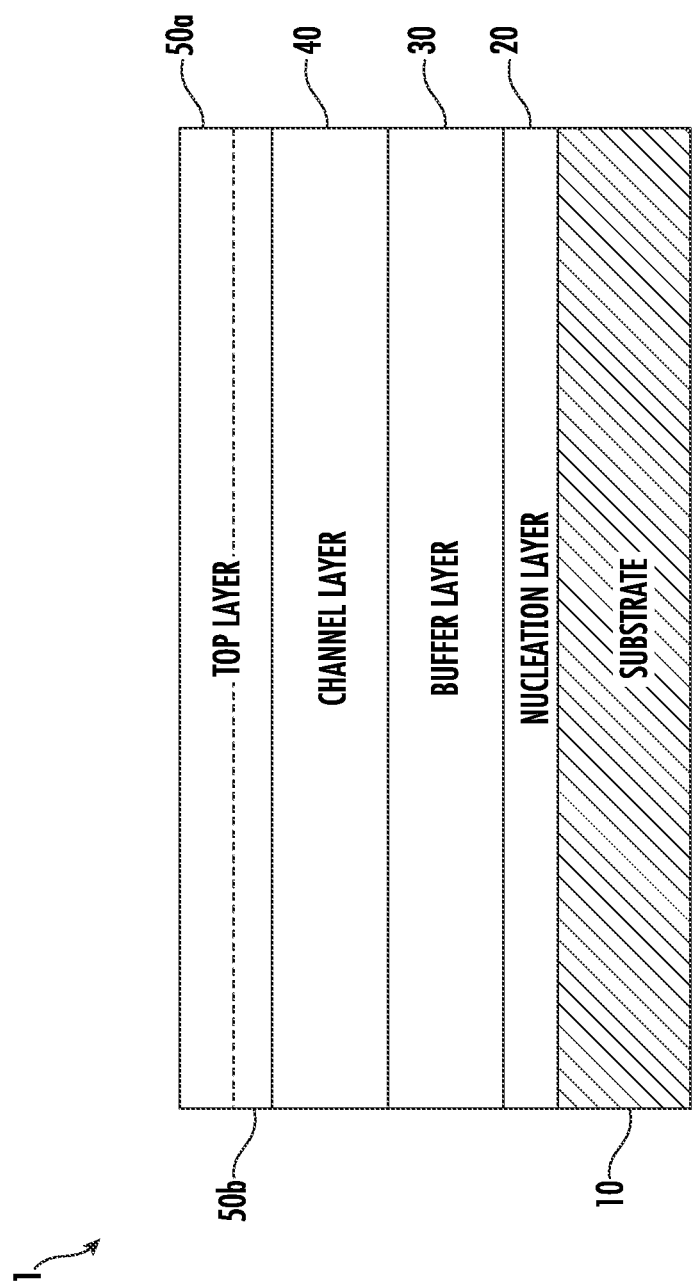
FIG. 1C is a cross-section of the diode structure of FIG. 1A taken along line B-B'.

FIG. 1C shows the cross-section of the III-nitride semiconductor diode structure 1 along the cutline B-B'. The diode structure 1 comprises a substrate 10, which may be made of Si, SiC, Sapphire, III-nitride semiconductor or any other suitable material.

In some embodiments, the semiconductor diode structure 1 may include a nucleation layer 20, formed on the substrate 10. The nucleation layer 20 may include AlN.

A buffer layer 30 is formed over the nucleation layer 20. The buffer layer 30 may have a thickness between 0.5 nm and several microns. A channel layer 40 is formed over the buffer layer 30. The buffer layer 30 and channel layer 40 comprise III-nitride semiconductors including GaN, AlGaN, InGaN, InAlN, InAlGaN and AlN. Free electrons exist in the channel layer 40 to conduct electrical current between the anode electrode 100 and the cathode electrode 120. The channel layer 40 may comprise a single layer such as a GaN layer, or multiple layers. In one example, the channel layer 40 comprises a back-barrier structure, such as a GaN layer over an AlGaN layer (GaN/AlGaN) or a GaN layer over an InGaN layer and another GaN layer (GaN/InGaN/GaN). In another example, the channel layer 40 has a superlattice structure formed by repeating a bi-layer structure of AlGaN/GaN or AlN/GaN. The thickness of the channel layer 40 may be 5 nm, although other thicknesses may be used. The thickness of the buffer layer 30 may be between zero and a few microns, although other thicknesses are within the scope of the disclosure.

A top layer 50 is formed over the channel layer 40. The top layer 50 comprises a barrier layer 50b made of III-nitride semiconductors selected from AlGaN, InAlN, AlN or InAlGaN. The barrier layer 50b is formed on the channel layer 40. The top layer 50 may optionally also have a cap layer 50a made of III-nitride semiconductors including GaN, AlGaN, InGaN, InAlGaN. When present, the cap layer 50a is formed on the barrier layer 50b. The barrier layer 50b and the cap layer 50a may be un-doped, doped with Si or doped with Mg or other impurities.

In one embodiment of the diode structure 1, the top layer 50 comprises a GaN cap layer 50a disposed on an AlGaN barrier layer 50b. The AlGaN barrier layer 50b is formed over channel layer 40 comprising GaN. Free electrons 41 are formed at the interface between the AlGaN barrier layer 50b and the GaN channel layer 40. Specifically, electrons 41 are formed as a two dimensional electron gas (2DEG) at the interface between the channel layer 40 and the barrier layer 50b.

Figure 1D:
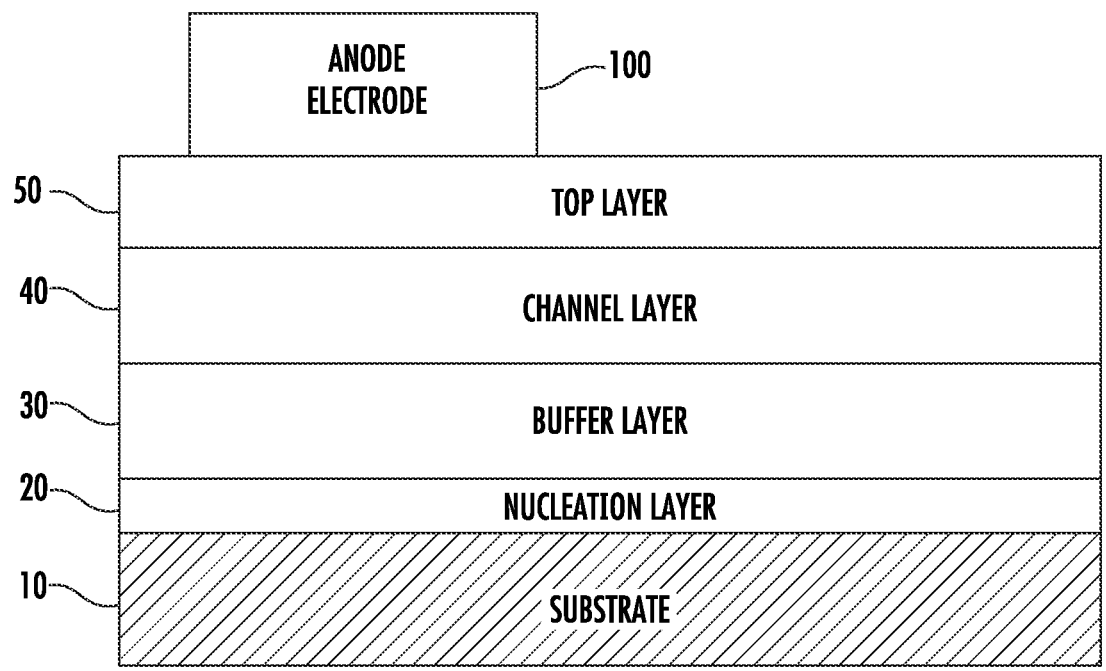
FIG. 1D is a cross-section of the diode structure of FIG. 1A taken along line C-C' according to one embodiment.
Figure 1E:
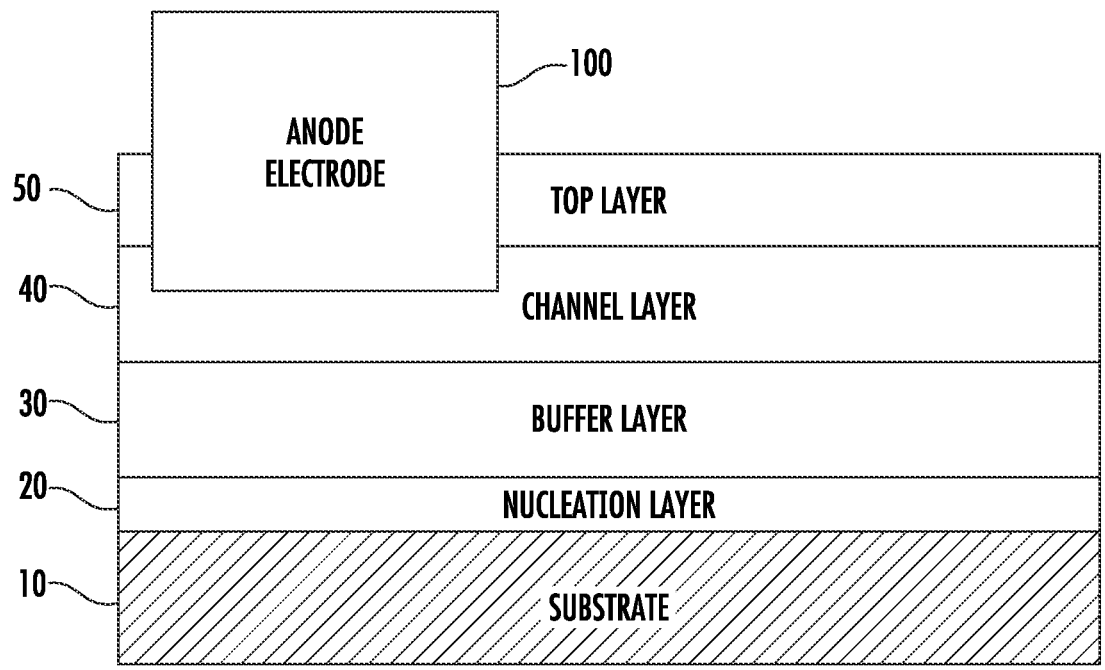
FIG. 1E is a cross-section of the diode structure of FIG. 1A taken along line C-C' according to another embodiment.
Figure 2A:
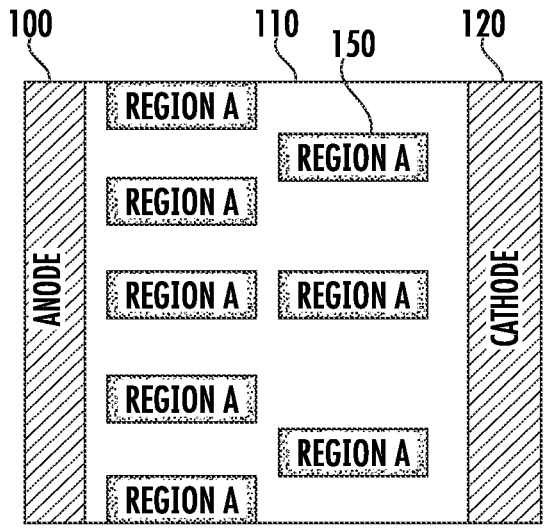
FIGS. 2A-2D are top views of a diode structure according to four embodiments.
Figure 2B:
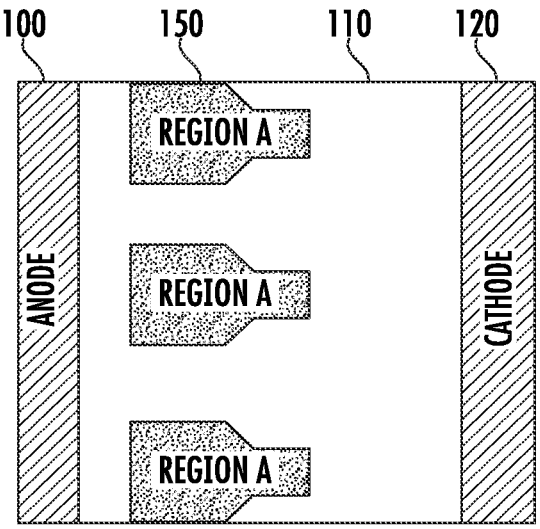
Figure 2C:
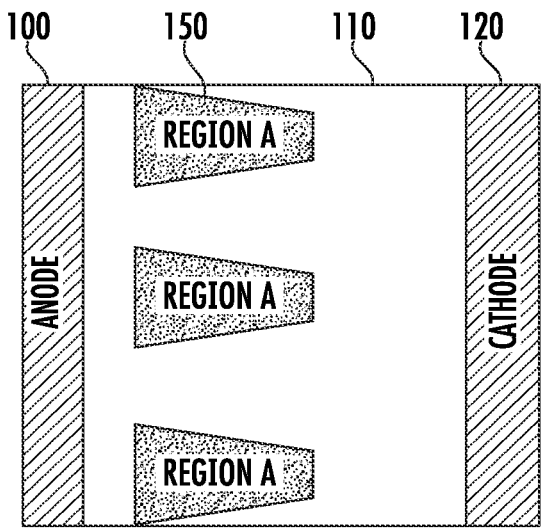
Figure 2D:
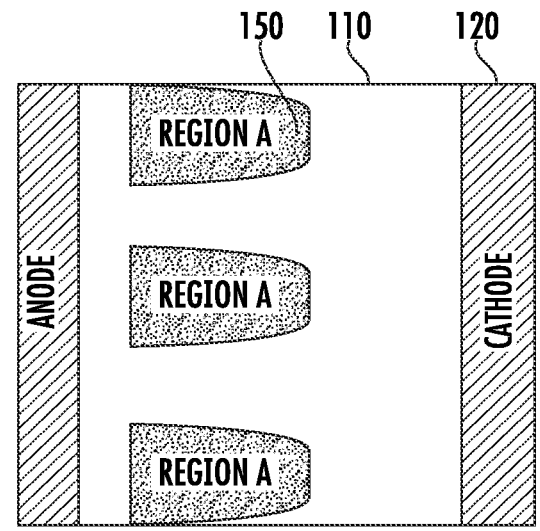

The III-nitride semiconductor diode shown in FIG. 1A comprises an anode electrode 100 that contacts the top layer 50 and forms a Schottky contact. The Schottky contact may be formed by having the anode electrode 100 contact the top surface of the top layer 50 (as shown in FIG. 1D), etching into the channel layer 40 and having the anode electrode 100 contact the sidewall of the top layer 50 (as shown in FIG. 1E) or a combination of top and sidewall contact.

The top layer 50 in the cathode area may be recessed and the cathode electrode 120 may contact the barrier layer 50b to form ohmic contact. In some embodiments, the cathode area is not recessed. In other embodiments, the recess may be etched into the barrier layer 50b.

The III-nitride semiconductor diode structure may be formed with Gallium-face or Nitrogen-face III-nitride semiconductors.

The III-nitride semiconductor diode structure may have one or more field plates over the access region 110 that modifies the electric field distributions.

The EDR regions 150 are formed between the anode electrode 100 and the cathode electrode 120. The anode electrode 100 may overlap part of the EDR regions 150, be flush with an edge of the EDR regions 150 or be separated from the EDR regions 150.

The separation distance, Wb, between each of the EDR regions 150 may change moving from anode electrode 100 towards the cathode electrode 120. FIGS. 2A-2D show top views of four embodiments of the semiconductor diode structure wherein the separation distance between adjacent EDR regions 150 is changing from the anode electrode 100 towards the cathode electrode 120. In certain embodiments, the separation distance between adjacent EDR regions 150 increases from the anode electrode 100 towards the cathode electrode 120. The shape of the EDR region 150 and its arrangement between the anode electrode 100 and the cathode electrode 120 may vary as shown in FIGS. 2A-2D. As a result, the average free-electron density may vary from the anode electrode 100 towards the cathode electrode 120.

The length of the EDR regions 150 may change from the anode electrode 100 towards the cathode electrode 120. In certain embodiments, the length of the EDR regions 150 increases from the anode electrode 100 towards the cathode electrode 120. In the case of non-regular polygons, such as those shown in FIGS. 2B-2D, each EDR region 150 may still have a length, La, a width, Wa, and a separation distance, Wb.

The width of the EDR regions 150, Wa, ranges from 10 nm to over 1 um. The separation between adjacent EDR regions 150, Wb, ranges from 10 nm to over 1 um. The ratio, Wb/(Wa+Wb), ranges from 5% to 95%. The length of the EDR regions 150, La, ranges from 10 nm to over 1 um. The edges of the EDR regions 150 may or may not be aligned with III-nitride crystalline planes.

Figure 3A:
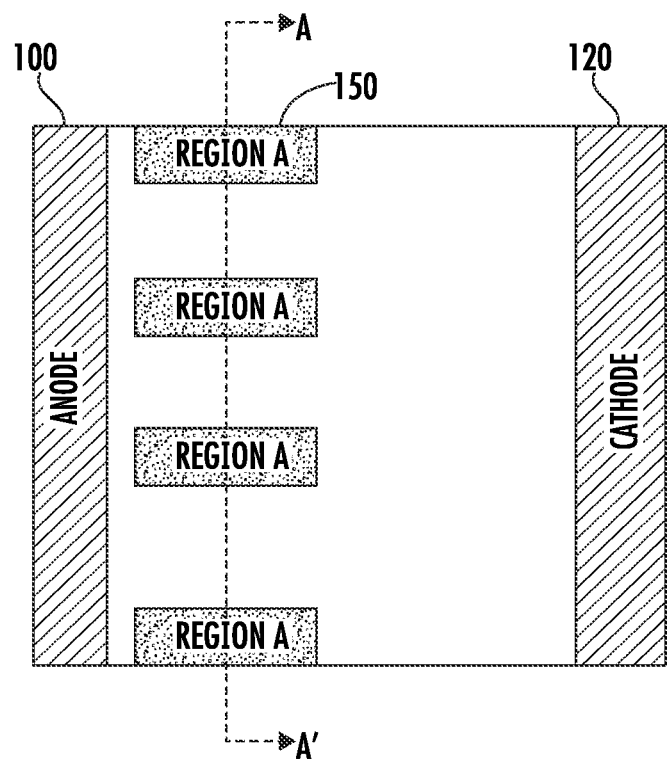
FIG. 3A is a top view of a diode structure according to another embodiment.

FIG. 3A shows a top view of a diode structure 1 having a plurality of EDR regions 150. FIGS. 3B-3E show four different cross-sectional views of the diode structure 1 through cut line A-A'. Each of these cross-sections shows a different example of an EDR region 150.

Figure 3B:
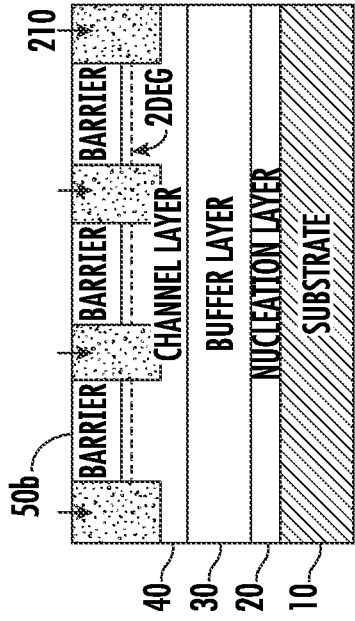
FIGS. 3B-3E are cross-sections of the diode structure of FIG. 3A along line A-A' according to four different embodiments.

In FIG. 3B, the EDR region 150 is formed by etching trenches 200 into the barrier layer 50b and optionally into the channel layer 40. The trenches 200 remove free electrons in the channel layer 40. This is because electrons travel at the interface between the barrier layer 50b and the channel layer 40. By etching through the barrier layer 50b, the area that is used to transport electrons is reduced. In some embodiments, the trenches 200 may be etched so as to remove an entire thickness of the barrier layer 50b in the EDR regions 150. In this way, the interface between the barrier layer 50b and the channel layer 40 in the EDR regions 150 is eliminated. In certain embodiments, the trenches 200 extends into the channel layer 40. In other embodiments, the trenches 200 do not extend through the entirety of the barrier layer 50b. Thus, the depth of the trenches 200 may be less than, the same as or greater than a thickness of the barrier layer 50b. The trenches 200 may be filled with a dielectric material, such as $SiN_x$, $SiO_2$, SiON, $Al_2O_3$, $ZrO_2$, $HfO_2$ and others. The trenches 200 may be created using any etching process.

Figure 3C:
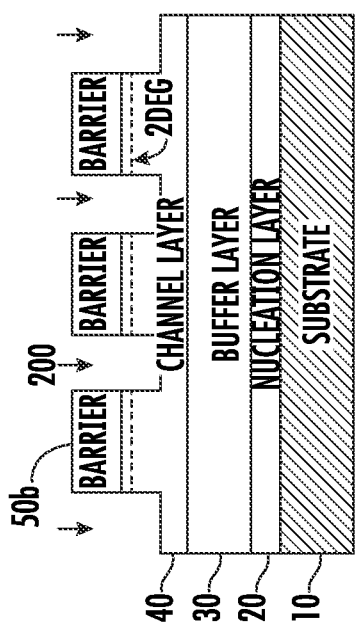

In FIG. 3C, the EDR region 150 is formed by ion implantation that lowers or eliminates the free electrons 41 in the channel layer 40 in the implanted region. The species used for the ion implantation may be selected from nitrogen, argon, fluorine, magnesium or any other suitable element. In certain embodiments, the energy of the implant may be selected so that the implanted region 210 extends through the entire thickness of the barrier layer 50b. In certain embodiments, the implant energy is sufficient so that the implanted region 210 extends into the channel layer 40. In other embodiments, the implantation depth may be less than the thickness of the barrier layer 50b. The dose may be selected to eliminate or reduce free electrons 41 near the interface between the channel layer 40 and the barrier layer 50b.

Figure 3D:
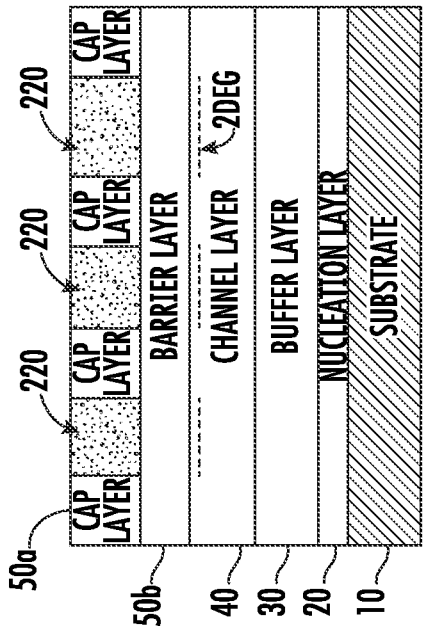

In FIG. 3D, the EDR region 150 is formed by disposing a cap layer 50a over the barrier layer 50b, wherein the cap layer 50a reduces or depletes the free electrons 41 in the channel layer 40 beneath the cap layer 50a. The other areas of the access region 110 may not have a cap layer 50a. In other words, the cap layer 50a is limited only to the EDR regions 150. Thus, free electrons 41 exist in the channel layer 40 where the cap layer 50a is absent. The cap layer 50a may include Mg-doped III-nitride semiconductors such as Mg-doped GaN, AlGaN, InN or InGaN. The cap layer 50a may have a thickness from 5 nm to over 200 nm.

Figure 3E:
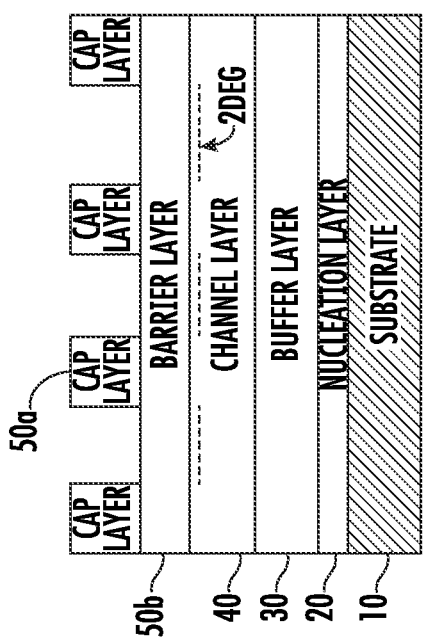

In FIG. 3E, similar to FIG. 3D, the free electron density reduction or depletion of free electrons 41 in the channel layer 40 of the EDR region 150 is achieved by having a cap layer 50a over the barrier layer 50b. However, the region outside the EDR regions 150 is replaced with doped regions 220. The doped region 220 is formed by introducing silicon, oxygen, hydrogen or any other suitable impurity in the cap layer 50a or into the channel layer 40 outside of the EDR region 150 to create free electrons in the channel layer 40 outside the EDR regions 150. The doped region 220 can also be formed by epi-regrowth. The depth of the doped regions 220 may be the same, smaller or thicker than the thickness of the cap layer 50a. The impurities may be introduced using ion implantation, epi-regrowth, or other suitable methods. As a result, free electrons 41 are formed in the channel layer under or in the doped regions 220, where the impurities create electron donors.

Thus, the EDR region 150 may be created through etching, implanting, epitaxy re-growth, using a cap layer or by using a cap layer in conjunction with a doped region.

A combination of the above embodiments is also possible to modify the free-electron density in the channel layer 40.

Having described various methods to create the EDR regions 150, several specific examples will be discussed.

Example 1

FIGS. 4A-4D show one embodiment. This embodiment utilizes the EDR regions 150 that are shown in FIG. 3D.

Figure 4A:
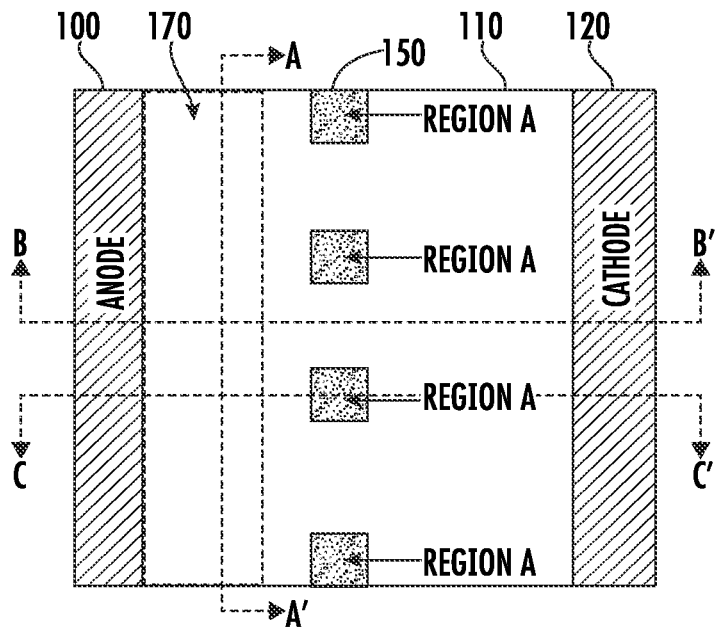
FIG. 4A is a top view of a diode structure according to another embodiment.

The top-view of the diode structure is shown in FIG. 4A. In this embodiment, an anode-connected field plate 170 may be disposed adjacent to and in contact with the anode electrode 100, and extend into the access region 110. The anode-connected field plate 170 may be an electrode and be constructed of the same material as the anode electrode 100. In this embodiment, the EDR regions 150 are formed using stripes of cap layer 50a in the access region 110 between the anode electrode 100 and cathode electrode 120. Of course, other shapes may also be used.

Figure 4B:
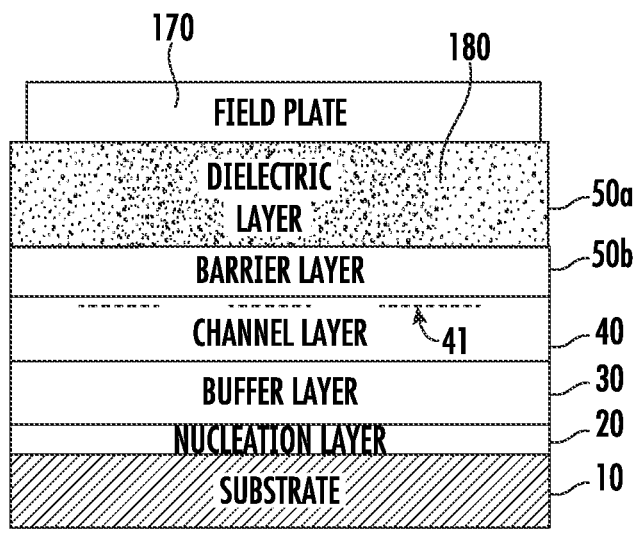
FIG. 4B shows the cross-section along A-A' cutline of FIG. 4A.

As shown in FIG. 4B, the cap layer 50a depletes the electrons in the channel layer 40 disposed beneath the cap layer 50a. However, between the adjacent EDR regions 150, free electrons 41 are formed in the channel as two-dimensional electron gas (2DEG) at the interface between the channel layer 40 and the barrier layer 50b.

Figure 4C:
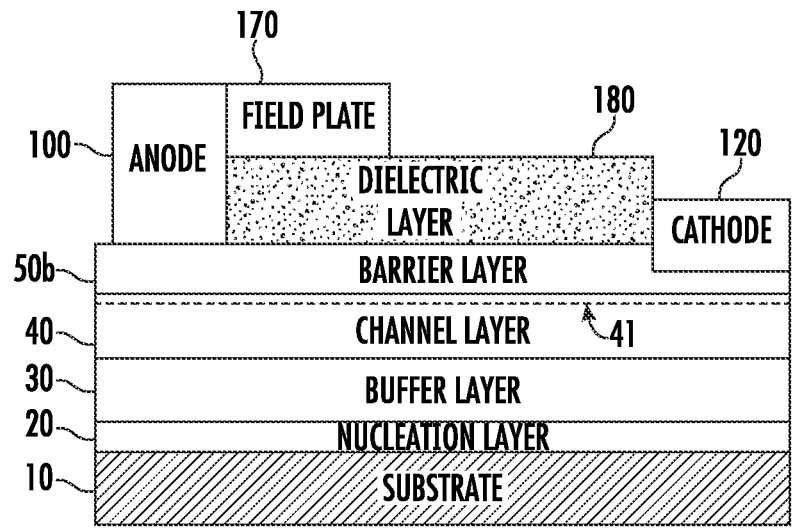
FIG. 4C-4D shows the cross section along B-B' cutline and C-C' cutline of FIG. 4A, respectively, according to one embodiment.
Figure 4D:
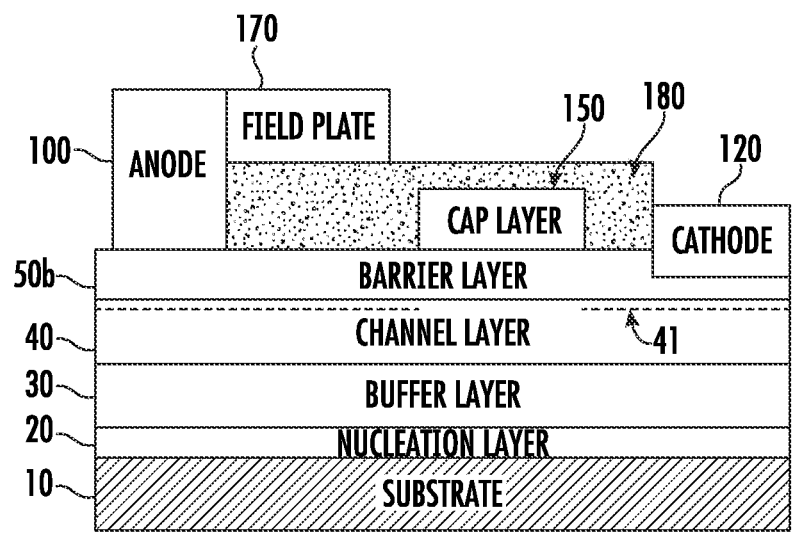

FIG. 4C shows the cross section along B-B' cutline of FIG. 4A. FIG. 4D shows the cross section along C-C' cutline of FIG. 4A. The two-dimensional electron gas is depleted under the cap layer 50a. The anode electrode 100 makes contact to the barrier layer 50b and forms a Schottky barrier. The anode-connected field plate 170 is formed over a dielectric layer 180 where the dielectric layer 180 covers the cap layer 50a as shown in FIG. 4D. Note that, in certain embodiments, the dielectric layer 180 extends from the anode electrode 100 to the cathode electrode 120. The dielectric layer 180 is selected from material including $SiO_2$, $Si_xN_y$, $Al_2O_3$, $SiO_xN_y$, or any other suitable dielectric material and their combination. The cathode side edge of the anode-connected field plate 170 does not extend beyond the cathode side edge of EDR regions 150 as shown in FIG. 4D. In other words, the cathode side edge of the EDR regions 150 is closer to the cathode electrode 120 than the cathode side edge of the anode-connected field plate 170. In certain embodiments, the cathode side edge of the anode-connected field plate 170 are at least as close to the cathode electrode 120 as the anode side edge of the EDR region 150. However, it is possible to have a second field plate (not shown) which extends over the cathode side edge of the EDR region 150 where the second field plate is disposed over a thicker dielectric layer than the anode-connected field plate 170.

Figure 4E:
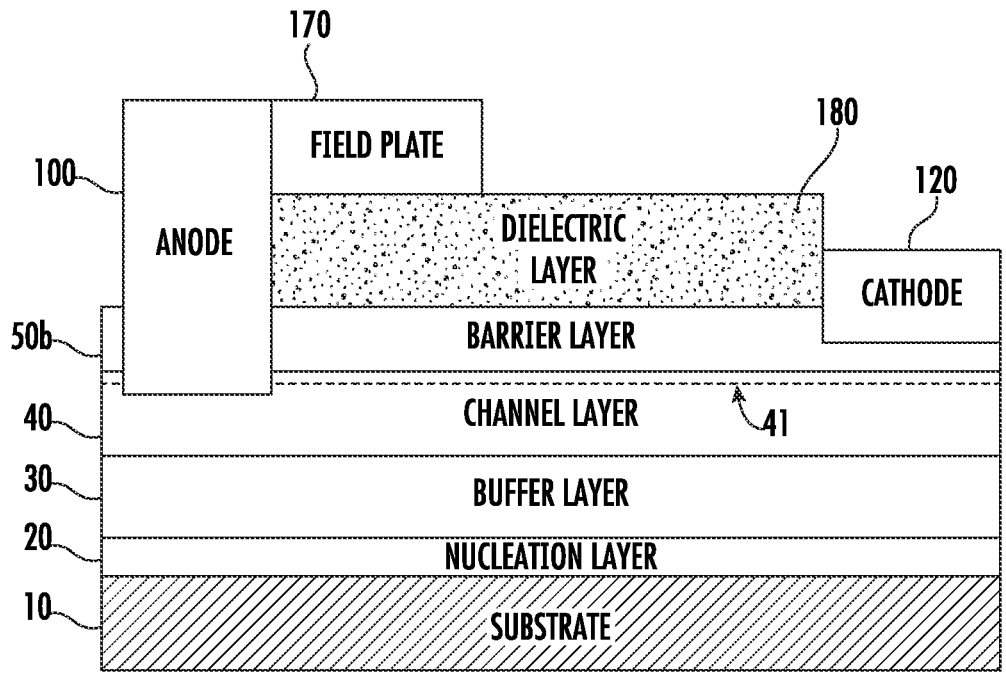
FIG. 4E-4F shows the cross-section along B-B' cutline and C-C' cutline of FIG. 4A, respectively, according to another embodiment.
Figure 4F:
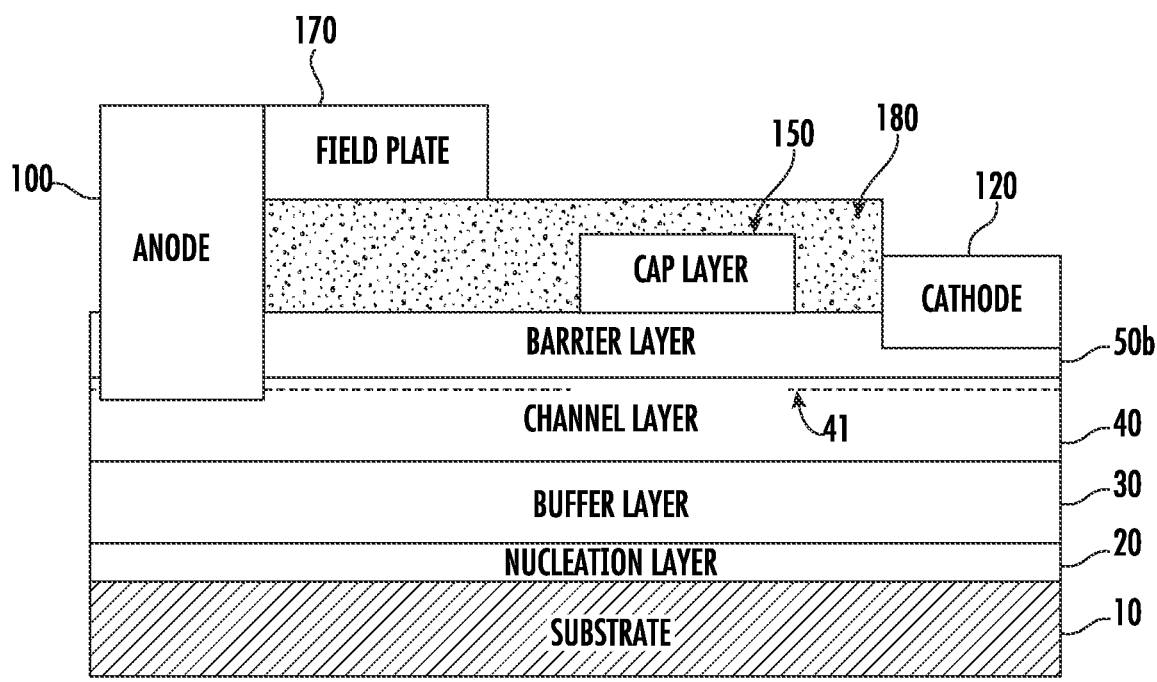

In FIGS. 4C-4D, a top Schottky contact between the anode electrode 100 and the barrier layer 50b is shown. This is achieved by having the anode electrode 100 contact the top surface of the barrier layer 50b. However, other embodiments are also possible. FIGS. 4E-4F show the cross section, along B-B' cutline and C-C' cutline of FIG. 4A, respectively, according to another embodiment. In this embodiment, the barrier layer 50b and optionally a portion of the channel layer 40 is etched to form a recessed region and the anode electrode 100 is disposed in this recessed region. Thus, in this embodiment, the anode electrode 100 contacts the sidewall of the barrier layer 50b, and therefore is contacting on the side of the 2 DEG.

The diodes in FIGS. 4A-4F are made with III-nitride semiconductors. The cap layer 50a may be formed by Mg-doped GaN, AlGaN or InGaN semiconductors with a thickness ranging from 2 nm to over 300 nm. The barrier layer 50b is made of III-nitride semiconductors including AlGaN, AlN, InAlN, GaN, InGaN, or InAlGaN. In one example, the barrier layer 50b has a sub-layer made of AlGaN which has a thickness between 1 nm and 20 nm and Al composition ranging between 5% and 100%. In another example, the barrier layer 50b has a few sub-layers such as an AlGaN layer over an AlN layer, or an AlN layer over an AlGaN layer. The channel layer 40 is made of GaN, InGaN, AlGaN or a combination of the material forming a multi-layer structure such as a super-lattice structure or a back-barrier structure. The band-gap of the barrier layer 50b in immediate contact with the channel layer 40 is larger than that of the channel layer 40 in immediate contact with the barrier layer 50b. The buffer layer 30 and nucleation layer 20 are made of III-nitride semiconductors. The substrate 10 is made of Si, SiC, Sapphire or any other suitable material.

The anode electrode 100 and the cathode electrode 120 are made of materials selected from Ni, Au, Ti, Al, TiN, W, WN, Pt, Cu, Mo and any other suitable material and their combination. The cathode electrode 120 may be formed in recessed regions in the barrier layer 50b under the cathode. The anode electrode 100 forms Schottky contact with the semiconductor while the cathode electrode 120 forms an ohmic contact.

Example 2

Figure 5A:
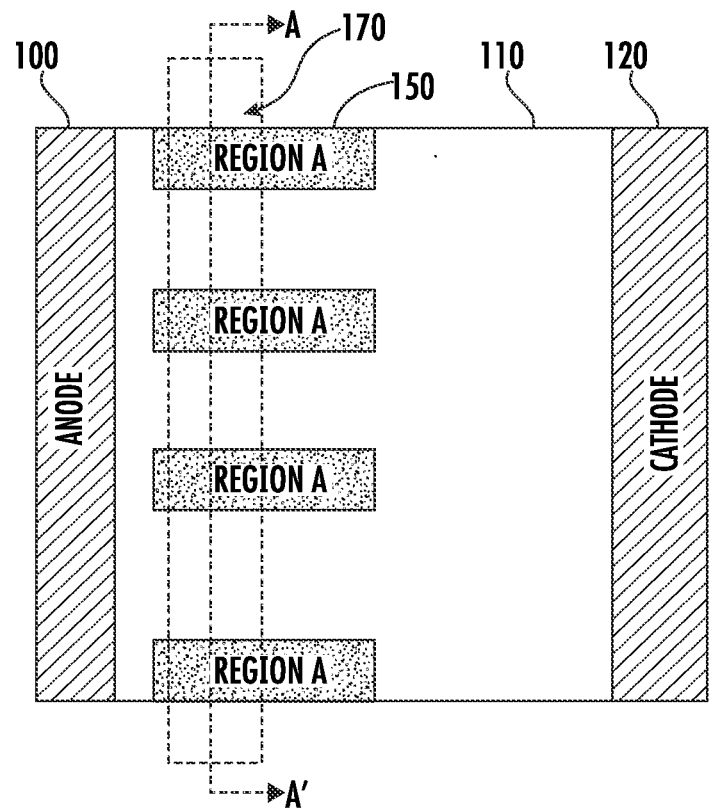
FIG. 5A is a top view of a diode structure having a dielectric layer and a field plate covering a portion of the electron density reduction region according to one embodiment.
Figure 5B:
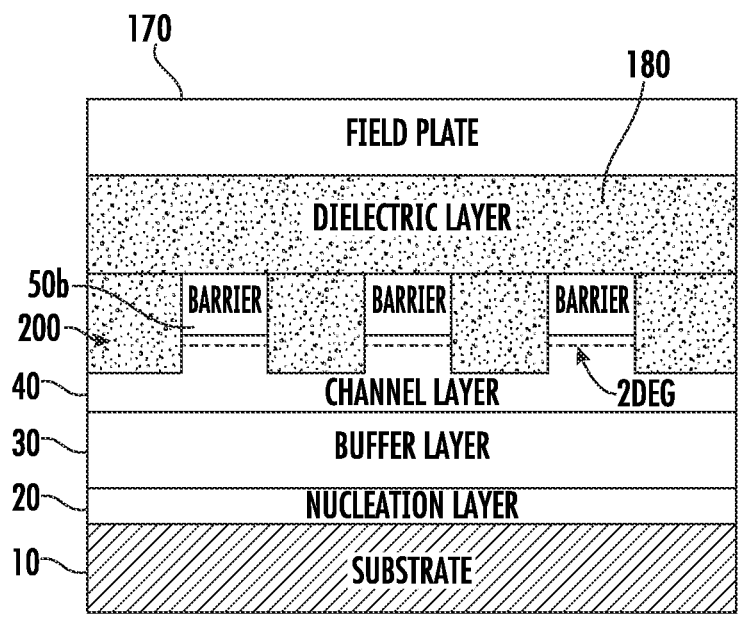
FIG. 5B is a cross-section of the diode structure of FIG. 5A along line A-A' in which the EDR regions comprise trenches.
Figure 5C:
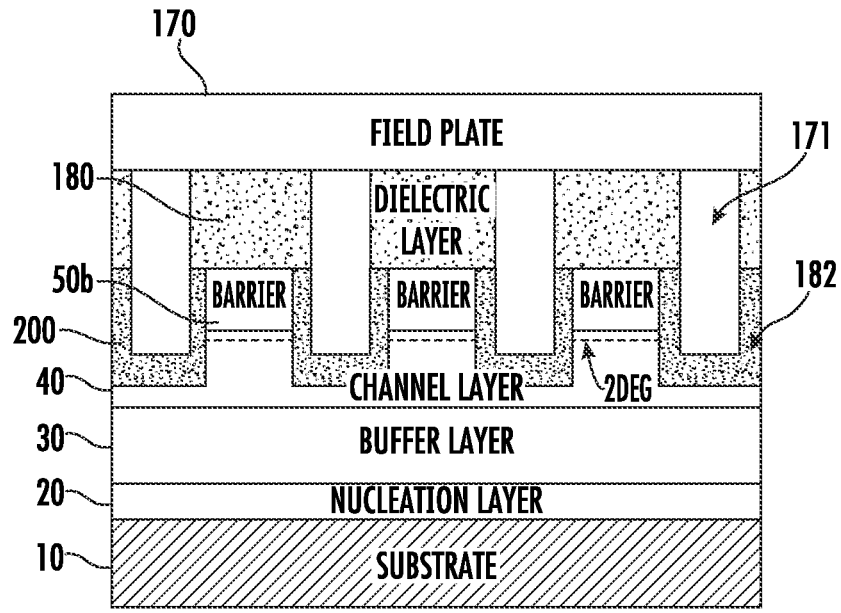
FIG. 5C is a cross-section of the diode structure of FIG. 5A along line A-A' in which the EDR regions comprise trenches with the field plate electrode is disposed in the trenches.
Figure 5D:
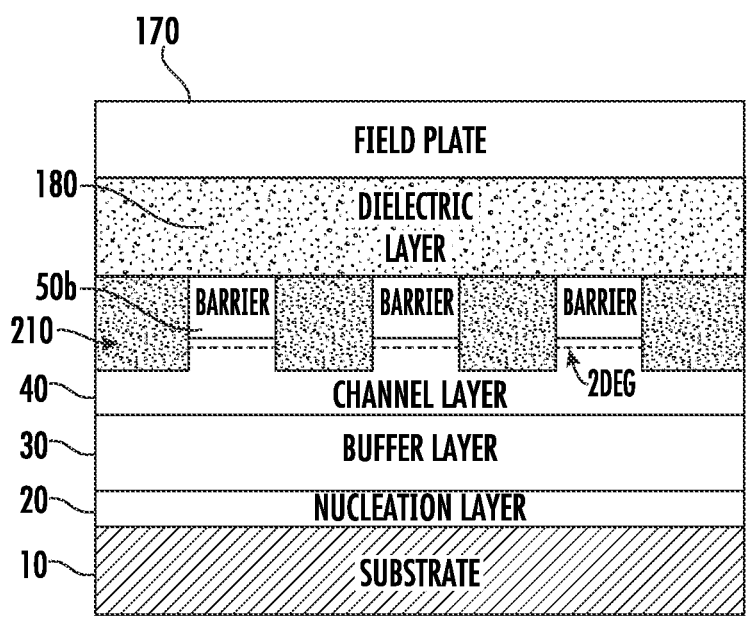
FIG. 5D is a cross-section of the diode structure of FIG. 5A along line A-A' wherein the electron density reduction region is an implanted region.

FIGS. 5A-5D shows three other embodiments. A top view of all of these embodiments is shown in FIG. 5A. The anode-connected field plate 170 is disposed in the access region 110. The field plate 170 covers at least a portion of the EDR regions 150. FIGS. 5B-5D show three different cross-sections taken along cut line A-A'.

In FIG. 5B, the EDR regions 150 are formed by creating trenches 200 in the barrier layer 50b and optionally into the channel layer 40, thereby reducing or removing the two-dimensional electron gas from the channel layer 40 in the EDR regions 150. Thus, free electrons 41 may only exist in portions of the access region 110 that are not EDR regions 150. A dielectric layer 180 is deposited in the trenches 200 and over the barrier layer 50b. The trenches 200 may be planarized after the dielectric material is deposited into the trenches 200. A field plate 170 is formed over the dielectric layer 180. The field plate 170 covers at least a portion of the EDR regions 150 and is separated from the barrier layer 50b by the dielectric layer 180. The field plate 170 may be connected to the anode electrode 100.

FIG. 5C shows another embodiment in which the EDR regions 150 comprise trenches 200. In FIG. 6C, the EDR regions 150 are formed by creating trenches 200 in the barrier layer 50b and into the channel layer 40, thereby removing the two-dimensional electron gas from the channel layer 40 in the EDR regions 150. Thus, free electrons 41 may only exist in portions of the access region that are not EDR regions 150. Further, the depth of the trench 200 extends below the interface between the barrier layer 50b and the channel layer 40. The field plate 170 also comprises protrusions 171 that extend into the trenches 200. The trenches 200 may be filled with a trench dielectric material 182. The trench dielectric material 182 may insulate the barrier layer 50b and the channel layer 40 from the protrusions 171 of the field plate 170. As shown in FIG. 6C, the bottom of the protrusions 171 extends beneath the interface of the barrier layer 50b and the channel layer 40 where the free electrons 41 are disposed. The trench dielectric material 182 may be the same material as the dielectric layer 180, or may be a different material.

Further, the dielectric layer 180 is disposed on top of the barrier layer 50b and separates the barrier layer 50b from the field plate 170. The dielectric layer 180 may be thicker than the thickness of the trench dielectric material 182. In other embodiments, the thickness of the dielectric layer 180 may be thinner or equal to the thickness of the trench dielectric material 182.

FIG. 5D shows another embodiment where the EDR region 150 is formed via ion implantation, as described in FIG. 3C. The species used for the ion implantation may be selected from nitrogen, argon, fluorine, magnesium or any other suitable element. The energy of the implant may be selected so that the implanted region 210 extends through the entire thickness of the barrier layer 50b and into the channel layer 40. This is done to eliminate the carriers. Alternatively, the energy of the implant may be selected so that the implanted region 210 extends through all or only a portion of the thickness of the barrier layer 50b. The implanted region 210 creates acceptors or traps reducing the free electrons 41 in the EDR region 150. A dielectric layer 180 covers the barrier layer 50b and the implanted regions 210. Further, a field plate 170 is formed over the dielectric layer 180. The field plate 170 may be connected to the anode electrode 100.

The barrier layer 50b is made of III-nitride semiconductors including AlGaN, AlN, InAlN, InGaN, GaN or InAlGaN. The III-nitride semiconductor of the barrier layer 50b immediately contacting the channel layer 40 has a wider band-gap than that of the III-nitride semiconductor of the channel layer 40 immediately contacting the barrier layer 50b.

Example 3

FIGS. 6 and 7 show other embodiments of the diode structure. These embodiments are similar to the embodiment shown in FIGS. 4A-4F except the EDR regions 150 extend to the anode area. In the diode structure shown in FIGS. 6A-6E, the EDR region 150 extends to the anode region but does not reach to the other side of the anode electrode 100. In other words, the EDR region 150 extends only part of the way under the anode electrode 100 in the length direction.

Figure 6A:
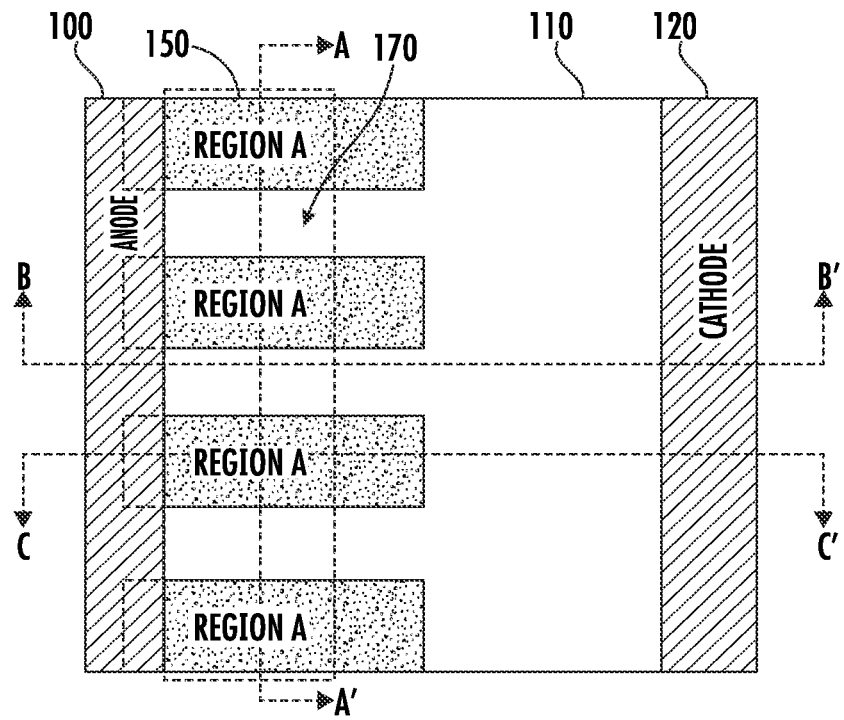
FIG. 6A is a top view of a diode structure wherein the electron density reduction region extends beneath the anode electrode according to one embodiment.
Figure 6B:
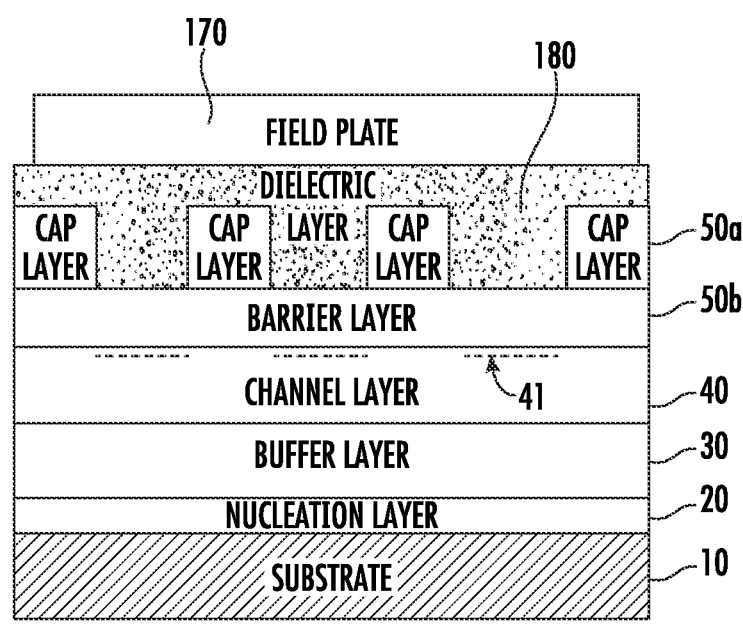
FIG. 6B is the electron density of the diode structure of FIG. 6A along line A-A'.
Figure 6C:
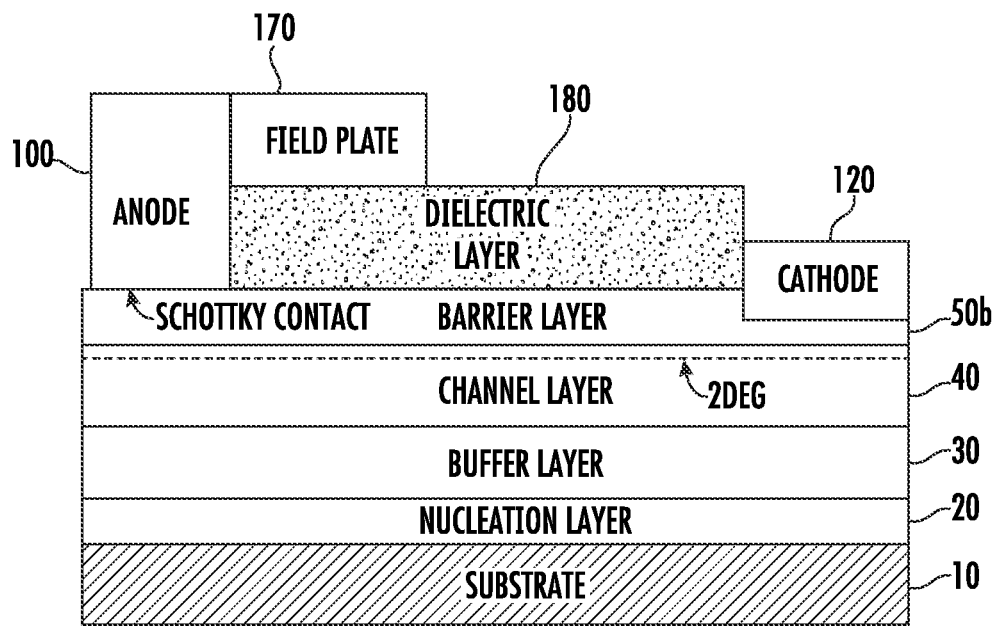
FIG. 6C is a cross-section of the diode structure of FIG. 6A taken along line B-B'.

FIG. 6A shows a top view of the diode structure, while FIG. 6B shows a cross-section along cutline A-A'.

As shown in FIG. 6B, the cap layer 50a depletes the electrons in the channel layer 40 disposed beneath the cap layer 50a. However, between the adjacent EDR regions 150, free electrons 41 are formed in the channel as two-dimensional electron gas (2 DEG) at the interface between the channel layer 40 and the barrier layer 50b.

Figure 6D:
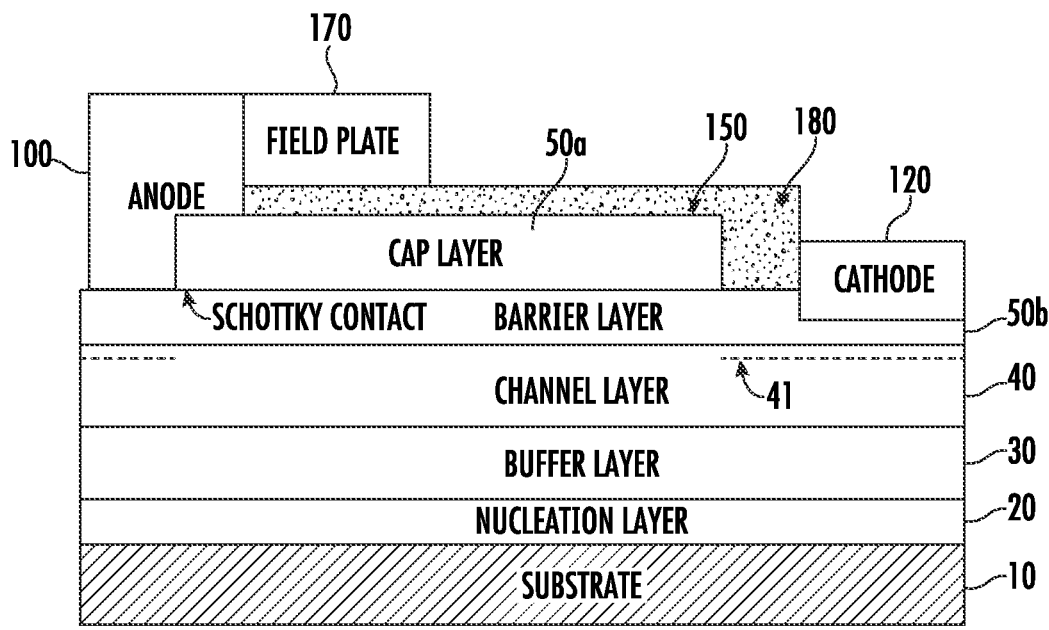
FIG. 6D is a cross-section of the diode structure of FIG. 6A taken along line C-C' according to one embodiment.
Figure 6E:
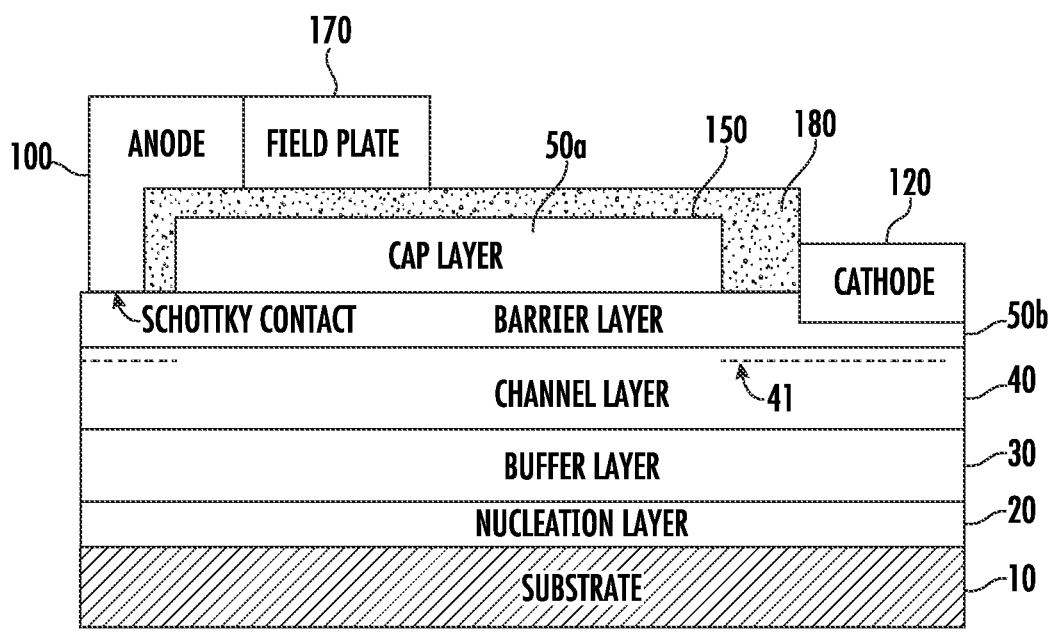
FIG. 6E is a cross-section of the diode structure of FIG. 6A taken along line C-C' according to another embodiment.

FIG. 6C shows the cross section along B-B' cutline of FIG. 6A. FIG. 6D-6E show the cross section along C-C' cutline of FIG. 6A according to two different embodiments. The two-dimensional electron gas is depleted under the cap layer 50a. The anode electrode 100 makes contact to the barrier layer 50b and forms a Schottky barrier. The anode-connected field plate 170 is formed over a dielectric layer 180 where the dielectric layer 180 covers the cap layer 50a as shown in FIG. 6D. Note that, in certain embodiments, the dielectric layer 180 extends from the anode electrode 100 to the cathode electrode 120. As described above, the dielectric layer 180 is selected from material including $SiO_2$, $Si_xN_y$, $Al_2O_3$, $SiO_xN_y$, or any other suitable dielectric material and their combination. The cathode side edge of the anode-connected field plate 170 does not extend beyond the cathode side edge of EDR regions 150 as shown in FIG. 6D. In other words, the cathode side edge of the EDR regions 150 is closer to the cathode electrode 120 than the cathode side edge of the anode-connected field plate 170. In certain embodiments, the cathode side edge of the anode-connected field plate 170 are at least as close to the cathode electrode 120 as the anode side edge of the EDR region 150. However, it is possible to have a second field plate (not shown) which extends over the cathode side edge of the EDR region 150 where the second field plate is disposed over a thicker dielectric layer than the anode-connected field plate 170.

In FIGS. 6C-6E, a top Schottky contact between the anode electrode 100 and the barrier layer 50b is shown. This is achieved by having the anode electrode 100 contact the top surface of the barrier layer 50b.

The anode electrode 100 may or may not contact the cap layer 50a over the EDR region 150. In the embodiment shown in FIG. 6D, a portion of the anode electrode 100 contacts the cap layer 50a. In other words, the cap layer 50a extends to a position beneath the anode electrode 100. In the areas that correspond to the EDR regions 150, the bottom surface of the anode electrode 100 may have two or more indentations to accommodate the cap layer 50a.

In the embodiment shown in FIG. 6E, the anode electrode 100 does not contact the cap layer 50a as the anode electrode 100 is separated from the cap layer 50a by the dielectric layer 180. The dielectric layer 180 covers the top surface of the cap layer 50a, as well as the sidewall proximate the anode electrode 100.

After forming the EDR regions 150, dielectric material is deposited on the entire surface. Then, via holes are formed to remove the dielectric material for deposition of the anode electrode 100. In FIG. 6D, the via opens up a portion of the cap layer 50a for the anode electrode 100 to make contact with the cap layer. In FIG. 6E, the via does not open the cap layer, 50*a*, which is similar to the embodiment shown in FIGS. 4F and 4D.

In all embodiments of FIGS. 6A-6E, there is a continuous Schottky contact between the anode electrode 100 and the barrier layer 50*b* along the width of the diode.

Figure 7A:
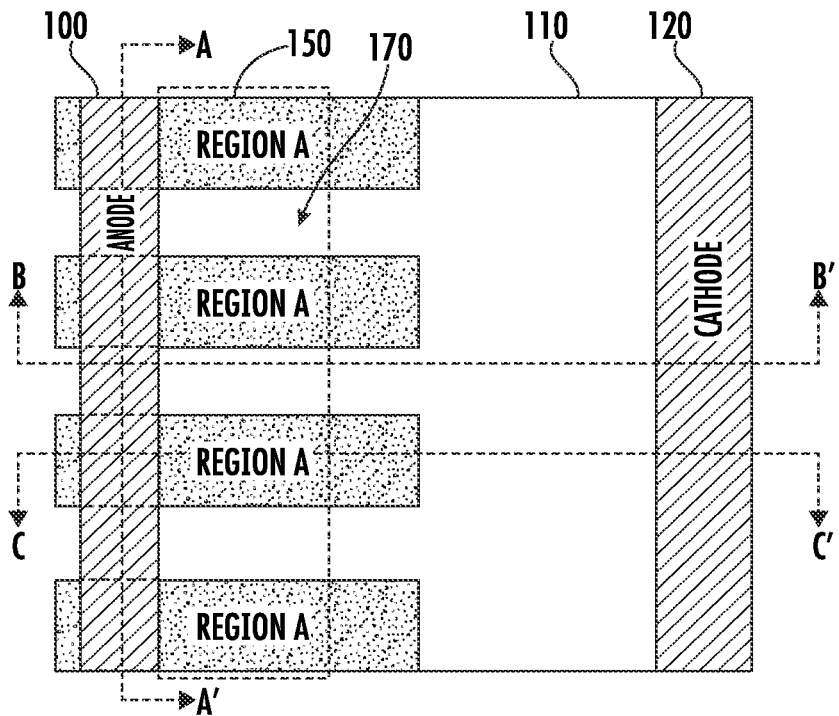
FIG. 7A is a top view of a diode structure wherein the electron density reduction region extends beneath the anode electrode and continues past the anode electrode according to one embodiment.
Figure 7B:
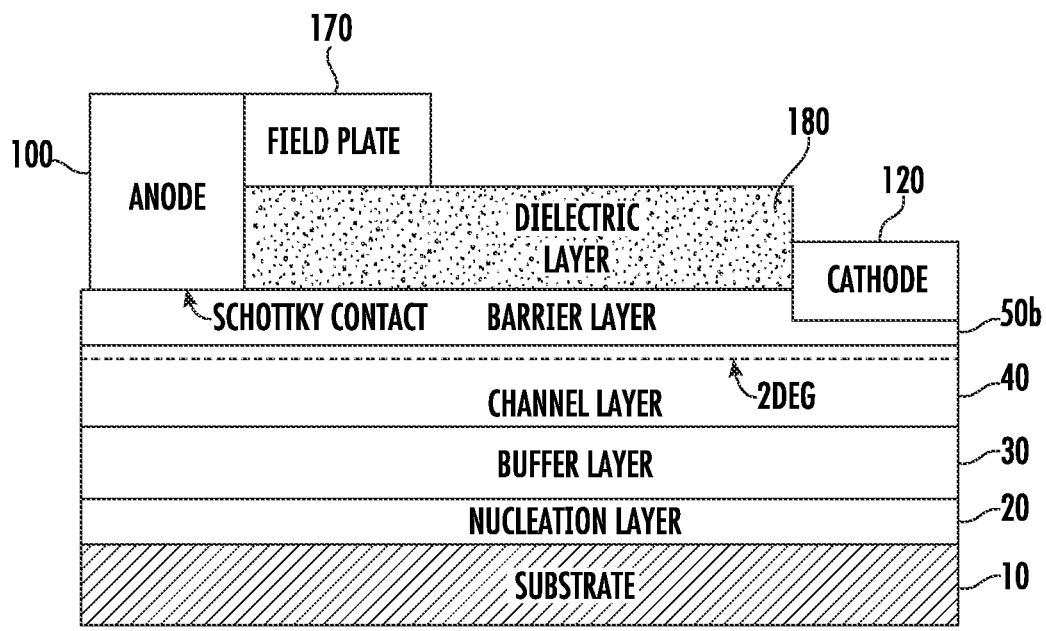
FIG. 7B is a cross-section of the diode structure of FIG. 7A taken along line B-B'.
Figure 7C:
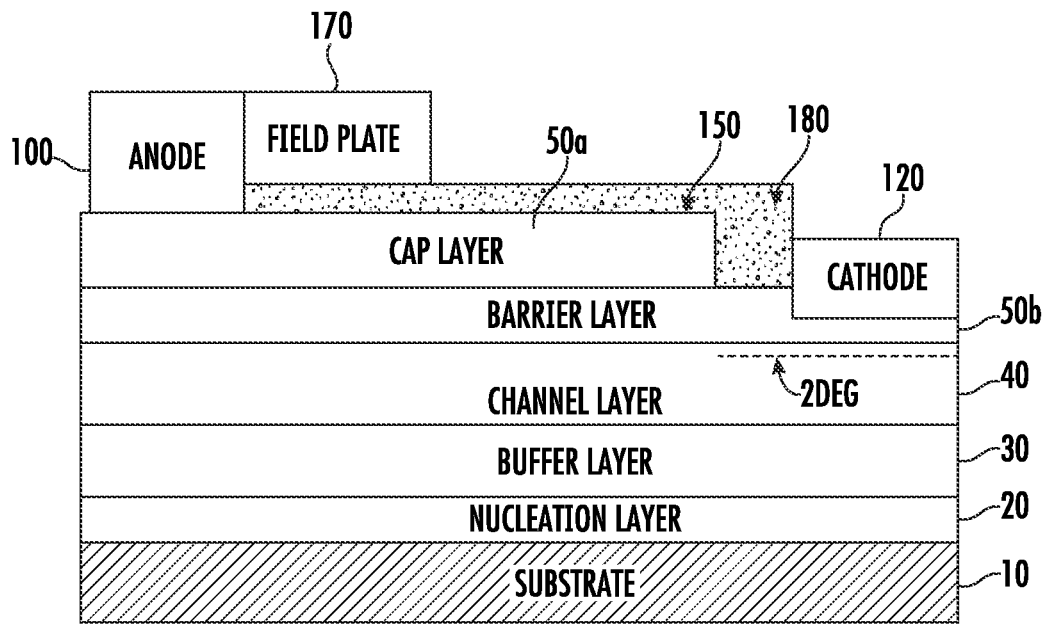
FIG. 7C is a cross-section of the diode structure of FIG. 7A taken along line C-C' according to one embodiment.
Figure 7D:
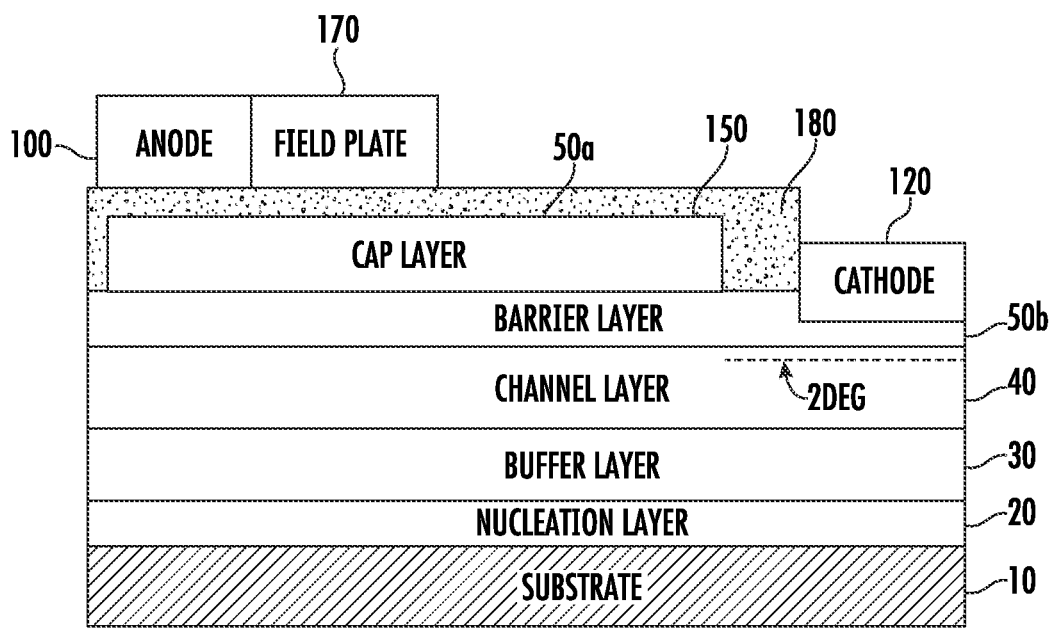
FIG. 7D is a cross-section of the diode structure of FIG. 7A taken along line C-C' according to another embodiment.
Figure 7E:
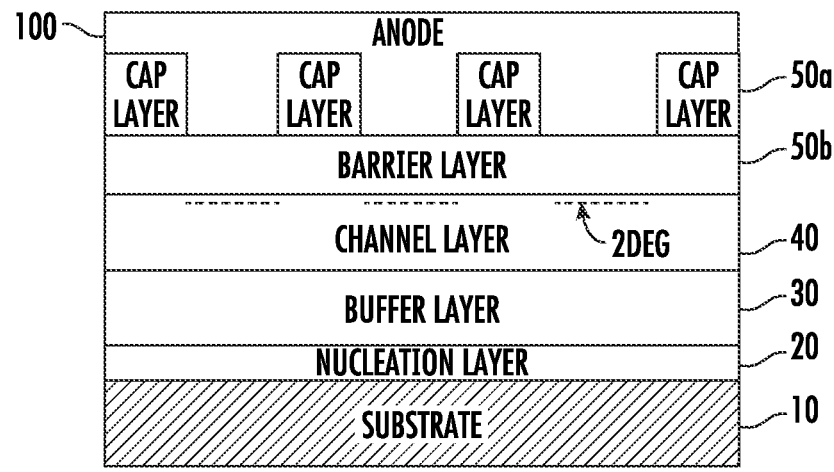
FIG. 7E is a cross-section of the diode of FIG. 7A taken along line A-A', according to the embodiment shown in FIG. 7C.
Figure 7F:
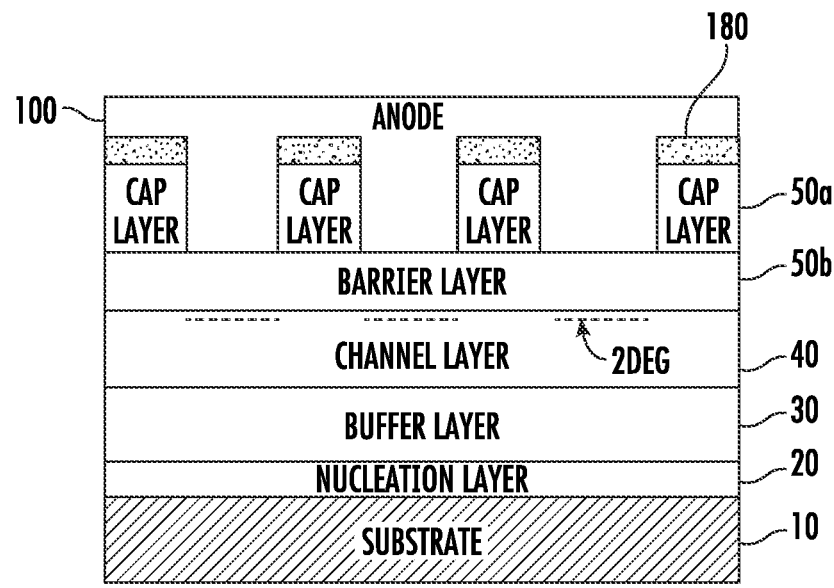
FIG. 7F is a cross-section of the diode of FIG. 7A taken along line A-A', according to the embodiment shown in FIG. 7D.

In yet another embodiment, FIG. 7A shows a top view of the diode structure, while FIG. 7B shows a cross-section along cutline B-B'. FIGS. 7C-7D show the cross section along C-C' cutline of FIG. 7A according to two different embodiments. FIG. 7E shows the cross section along A-A' cutline of FIG. 7A for the embodiment shown in FIG. 7C. FIG. 7F shows the cross section along A-A' cutline of FIG. 7A for the embodiment shown in FIG. 7D. In these embodiments, the cap layer 50*a* extends under the anode electrode 100 and continues past the anode electrode 100.

In both embodiments, shown in FIGS. 7C-7F, the Schottky contact between the anode electrode 100 and the barrier layer 50*b* becomes a plurality of disconnected regions. These disconnected regions may be connected through the anode or other backend metals. Further, in both embodiments, the cap layer 50*a* extends under the length of the anode electrode 100.

In FIGS. 7C and 7E, the bottom surface of the anode electrode 100 contacts the top surface of the cap layer 50*a*. In FIGS. 7D and 7E, the dielectric layer 180 also extends beneath the anode electrode 100, such that the anode electrode 100 is separated from the cap layer 50*a* by the dielectric layer 180. The separation may be anywhere between 1 nm to greater than 250 nm. The dielectric layer 180 may be formed on top of a continuous cap layer 50*a*. Then the EDR region 150 can be formed by etching the dielectric layer 180 and the cap layer 50*a*. The anode electrode 100 is then deposited such as the top side of the cap layer 50*a* is insulated while its sidewall is exposed to the anode electrode 100, as shown in FIG. 7F.

While Examples 1-3 all utilize the EDR regions 150 described in FIG. 3D, any of the embodiments may also be utilized. With respect to FIGS. 3B-3C and 3E, the anode electrode 100 may contact the EDR region 150 directly (as shown in FIGS. 6D and 7C) or a dielectric layer 180 may be disposed between the anode electrode 100 and the EDR region 150.

Figure 8:
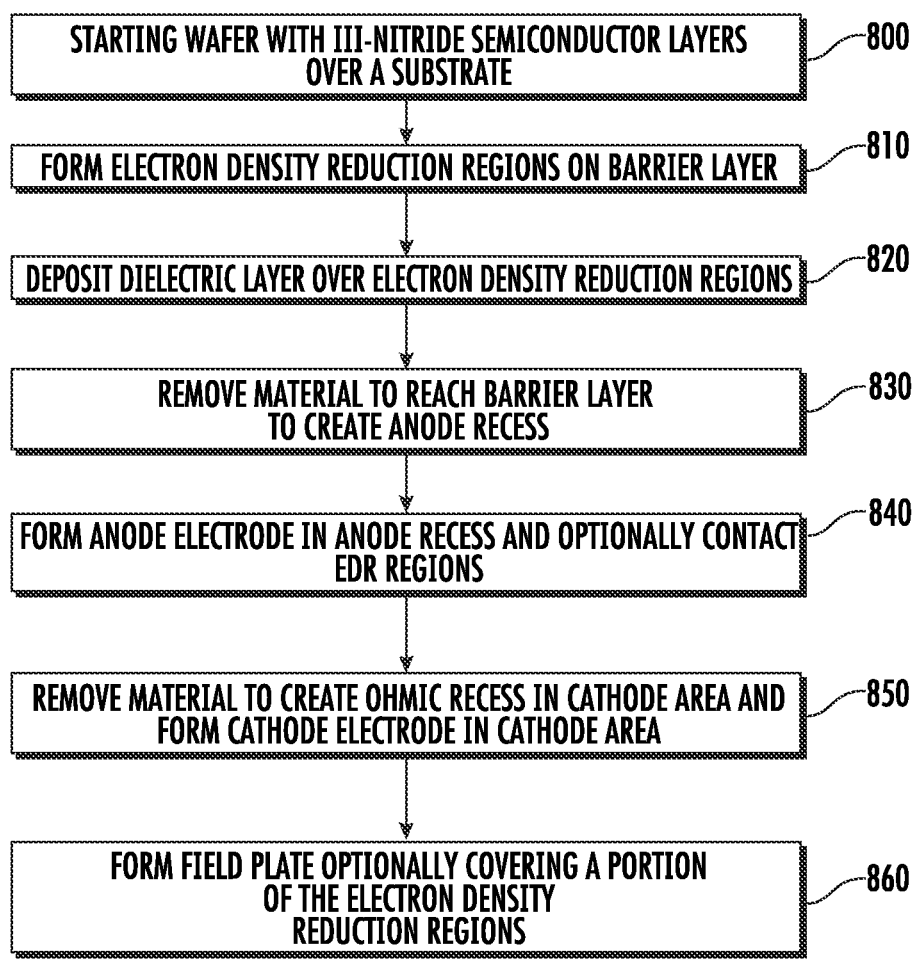
FIG. 8 shows a flowchart that shows the processes for making the embodiments described herein.

An example of fabricating the diode structure described herein is shown in FIG. 8. First, as shown in Box 800, a wafer is provided. The wafer comprises a substrate 10, a nucleation layer 20 on top of the substrate and a buffer layer 30 disposed on the nucleation layer 20. A channel layer 40 is disposed in the buffer layer 30 and a barrier layer 50*b* is disposed in the channel layer.

Next, as shown in Box 810, the EDR regions 150 are formed on or in the barrier layer 50*b*. As described above, this may be achieved in a number of ways. The EDR regions 150 may be in the access region 110 only, in the access region 110 and partially underneath the anode electrode 100, or in the access region 110 and completely underneath the anode electrode 100.

As shown in FIG. 3B, the EDR regions 150 may be formed by etching portions of the barrier layer 50*b* to create trenches 200. In certain embodiments, the depth of the trenches 200 may be greater than the thickness of the barrier layer 50*b*. In other embodiments, the depth of the trenches 200 may be equal to or less than the thickness of the barrier layer 50*b*.

As shown in FIG. 3C, the EDR regions 150 may be formed by implanting species into the barrier layer 50*b* to create implanted regions 210. These implanted regions 210 may extend through the barrier layer 50*b* and into the channel layer 40.

As shown in FIG. 3D, the EDR regions 150 may be formed by depositing a cap layer 50*a* on the barrier layer 50*b*. The cap layer may be Mg-doped nitride semiconductors, such as GaN. Portions of the cap layer 50*a*, which are not part of the EDR regions 150 are then etched. The portions of the cap layer 50*a* that remain form the EDR regions 150.

As shown in FIG. 3E, the EDR regions 150 may be formed by depositing a cap layer 50*a* on the barrier layer 50*b*. Portions of the cap layer 50*a*, which are not part of the EDR regions 150 are then doped to become doped regions 220.

After the EDR regions 150 have been formed, a dielectric layer 180 is then deposited over the EDR regions 150, as shown in Box 820. The dielectric layer 180 may be deposited on the entirety of the barrier layer 50*b* (or the cap layer 50*a* if present). Thus, the dielectric layer 180 coats the barrier layer 50*b* in the access region 110. The dielectric layer 180 also fills or partially fills the trenches (if present).

An opening is then etched into the dielectric layer 180, as shown in Box 830. This opening is in the position needed for the anode electrode 100. This opening may be to a depth to allow a Schottky contact. Next, as shown in Box 840, the anode electrode 100 is formed in the anode recess. In certain embodiments, the anode electrode 100 may contact the EDR region 150, such as the cap layer 50*a*. This contact may be with the top surface of the EDR region 150 or the side of the EDR region 150.

Next, as shown in Box 850, an additional opening is created by etching. This opening in the cathode area. This opening may include ohmic recesses in the dielectric layer 180 and to or into the barrier layer 50*b* in the cathode area. Next, the cathode electrode is formed in the cathode recess.

The sequence of forming the anode electrode 100 and the cathode electrode 120 may be changed. For example, anode electrode 100 may be formed after the formation of the cathode electrode 120.

Finally, as shown in Box 860, the field plate 170 is formed and optionally covers at least a portion of the EDR regions 150.

Additional process steps not shown in FIG. 8 include depositing additional dielectric layers, and forming additional field plates, vias and interconnections.

The embodiments described above in the present application may have many advantages. The EDR regions 150 enable local control of the charge density in the access region 110 and provide control of the electric field in this access region 110. This control may be beneficial in at least two respects. First, this allows control of the trapping in the access region and dynamic on-resistance. Second, a reduction in electric field in certain locations may improve the breakdown voltage. This may improve the maximum voltage and reliability of the diode.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A diode structure for use in a III-Nitride (III-N) semiconductor device, comprising:
   a channel layer;
   a barrier layer, wherein electrons are formed at an interface between the channel layer and the barrier layer;
   an anode electrode in Schottky contact with the barrier layer;
   a cathode electrode disposed in an ohmic recess in contact with the barrier layer, wherein a region between the anode electrode and the cathode electrode is defined as an access region;
   one or more electron density reduction regions disposed in the access region which extend at least partly beneath the anode electrode, wherein an electron density in the electron density reduction regions is reduced as compared to other portions of the access region; and
   a field plate disposed above at least a portion of the electron density reduction regions, wherein portions of the field plate are separated from the electron density reduction region by a dielectric layer.

2. The diode structure of claim 1, wherein each electron density reduction region has a length (La) and a width (Wa), and is separated from an adjacent electron density reduction region by a separation distance (Wb), wherein the separation distance (Wb) changes moving from the anode electrode to the cathode electrode.

3. The diode structure of claim 1, wherein the electron density reduction regions comprise trenches wherein a depth of the trenches is less than, the same as, or greater than a thickness of the barrier layer.

4. The diode structure of claim 1, wherein the electron density reduction regions comprise implanted regions in the barrier layer, wherein a depth of the implanted regions is less than, the same as, or greater than a thickness of the barrier layer.

5. The diode structure of claim 4, wherein the implanted regions are implanted with nitrogen, argon, fluorine, or magnesium.

6. The diode structure of claim 1, wherein the electron density reduction regions comprise a cap layer disposed on the barrier layer, and wherein the cap layer is not disposed on the barrier layer in the other portions of the access region, and the cap layer comprises a Mg-doped III-nitride semiconductor.

7. The diode structure of claim 1, further comprising a cap layer disposed on an entirety of the barrier layer in the access region, and wherein impurities are introduced into the cap layer disposed in the other portions of the access region to form doped regions and wherein the impurities are not introduced into the cap layer in the electron density reduction regions.

8. The diode structure of claim 7, wherein the cap layer comprises a Mg-doped III-nitride semiconductor and the impurities comprise silicon, oxygen or hydrogen.

9. The diode structure of claim 1, wherein a cap layer comprising a Mg-doped III-nitride semiconductor is disposed in the electron density reduction regions and not disposed in other portions of the access region.

10. The diode structure of claim 9, wherein a portion of a bottom surface of the anode electrode contacts a top surface of the electron density reduction regions.

11. The diode structure of claim 9, wherein a dielectric layer is disposed between a bottom surface of the anode electrode and a top surface of the electron density reduction regions.

12. The diode structure of claim 11, wherein the anode electrode contacts at least a side of the cap layer.

13. The diode structure of claim 1, wherein the electron density reduction regions extend past the anode electrode.

14. The diode structure of claim 13, wherein the Schottky contact between the anode electrode and the barrier layer comprises a plurality of disconnected regions.

15. The diode structure of claim 1, wherein a cathode side edge of the electron density reduction regions is closer to the cathode electrode than a cathode side edge of the field plate.

16. The diode structure of claim 1, wherein the dielectric layer is disposed in the region between the anode electrode and the cathode electrode.

17. The diode structure of claim 1, further comprising a second field plate disposed between the field plate and the cathode electrode.

18. The diode structure of claim 1, wherein the field plate is connected to the anode electrode.

19. The diode structure of claim 1, wherein the cathode is in ohmic contact with the barrier layer.

* * * * *